United States Patent [19]

Kawagoe et al.

[11] 4,015,219

[45] Mar. 29, 1977

[54] ELECTRONIC CIRCUIT USING FIELD EFFECT TRANSISTOR WITH COMPENSATION MEANS

[75] Inventors: Hiroto Kawagoe, Kodaira; Kosei Nomiya, Tokyo, both of Japan

[73] Assignee: Hitachi, Ltd., Japan

[22] Filed: Nov. 18, 1975

[21] Appl. No.: 632,978

Related U.S. Application Data

[62] Division of Ser. No. 453,168, March 20, 1974, Pat. No. 3,975,649.

[30] Foreign Application Priority Data

Jan. 16, 1974 United Kingdom .............. 2105/74

[52] U.S. Cl. ................................ 331/111; 331/57; 331/176
[51] Int. Cl.² ................... H03K 3/33; H03K 3/282
[58] Field of Search ............ 331/108, 57, 111, 175, 331/176; 307/205, 214, 270, 251, 297, 304, 310

[56] References Cited

UNITED STATES PATENTS 3,931,588  1/1976  Gehweiler .................... 331/108 B Primary Examiner—John Kominski
Attorney, Agent, or Firm—Craig & Antonelli

[57] ABSTRACT

In order to provide compensation for changes in the ambient temperature and supply voltage for an electronic circuit, such as a pulse generator circuit made up of MOSIC structure, a field effect transistor circuit includes a high value resistor and an enhancement and depletion type MOSFET, connected in parallel. The drain electrodes of the MOSFETs are connected to the power supply through the resistor and are also connected to the gate electrode of a depletion type load MOSFET which is the load transistor for an enhancement type MOSFET. When the compensating circuit is provided in a pulse generator circuit, instability in the oscillating frequency of the pulse generator due to changes in ambient temperature and supply voltage is overcome and the difference in the oscillating periods for the various MOSICs are decreased.

8 Claims, 7 Drawing Figures

4,015,219

ELECTRONIC CIRCUIT USING FIELD EFFECT TRANSISTOR WITH COMPENSATION MEANS

This is a division of application Ser. No. 453,168 filed Mar. 20, 1974 and now U.S. Pat. No. 3,975,649.

BACKGROUND OF THE INVENTION

In present day technology, wherein MOSIC circuitry is employed in a variety of electronic circuits, recent improvements have been directed into incorporating all of the circuit elements which are necessary for small-sized calculators into a single semiconductor chip. As one type of circuit which may be so constructed, a clock pulse generator circuit, made up of a closed-loop arrangement of three inverters and capacitors connected therebetween has been developed. This circuit is described in U.S. patent application entitled Pulse Generator Ser. No. 433,483 filed Jan. 15, 1974 by S. Shimada et al and assigned to the assignee of present application, and relates to the subject matter of Japanese priority application No. 6, 1971/73 filed in Japan on June 4, 1973.

One of the problems associated with such electronic circuitry is the instability of the same due to changes in ambient temperature and the power supply voltage therefor. Moreover, when electronic circuits are manufactured in the form of MOSIC structure, the oscillating periods among the variously manufactured MOSICs will vary over a wide range due to the differences in the characteristics of the respective circuits.

As a result, some form of compensation is necessary to prevent this instability and to compensate for the differences of the oscillating periods among the mass-produced pulse generator MOSICs.

OBJECTS OF THE INVENTION

It is, accordingly, an object of the present invention to provide a compensation circuit to compensate for instability in the electrical characteristics of a MOSIC (particularly a load MOSFET) due to changes in the ambient temperature.

It is another object to provide a circuit for compensating for the instability of the electric characteristics of a MOSIC (particularly a load MOSFET) due to changes in power supply voltage.

It is a further object to provide a compensation circuit which compensates for differences in the electric characteristics which may be distributed among mass-produced MOSICs over a wide range.

It is still a further object of the present invention to provide a pulse generator circuit which has a stable duty ratio or oscillating period with respect to changes in ambient conditions of the circuit.

It is still another object of the present invention to provide a pulse generator circuit which may be manufactured according to MOSIC technology, so that variations in the duty ratio or oscillating periods among the various MOSICs are kept to a minimum.

BRIEF DESCRIPTION OF THE INVENTION

In order to achieve the above objects, the compensation circuit of the present invention employs a high value resistor and a pair of MOSFETS connected in parallel, one of which is of the enhancement type and the other of which is of the depletion type, connected to the input of a pulse generator circuit, for example. The drain electrodes of the respective MOSFETS are connected to the power supply through the resistor, and are also connected to the gate electrode of the depletion load MOSFET which is connected to an enhancement type MOSFET. For changes in the ambient temperature or supply voltage, changes in the electrical characteristics of the pulse generator circuit are compensated by the changes in the electrical characteristics and conditions of the compensation circuit. In its simplest form, the compensation circuit need only comprise a single MOSFET and resistor connected thereto between the circuit for which compensation is desired and the power source.

DETAILED DESCRIPTION OF THE INVENTION

Figure 1:
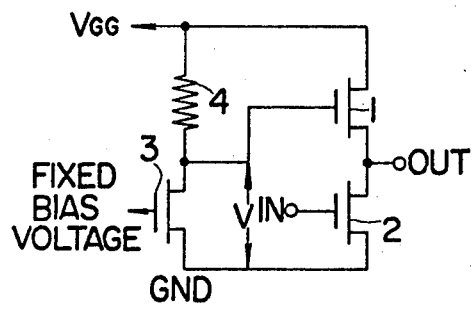
FIG. 1 depicts a basic circuit arrangement of the present invention in which the compensation circuit employs a single MOSFET and resistor.

With attention now directed to the circuit configuration shown in FIG. 1, the compensation circuit includes a series connection of a high valued resistor 4 (ranging in the value from 50KΩ to 100KΩ) and a MOSFET 3, connected between power supply source $V_{GG}$ and ground. The connection point of resistor 4 and MOSFET 3 is connected to the gate of MOSFET 1 which, together with MOSFET 2, forms an inverter circuit, MOSFET 1 being the load for MOSFET 2.

Now, when the ambient temperature of the circuit increases, the current flowing through MOSFET 1 will decrease, since the threshold voltage $V_{th}$ of MOSFET 1 increases. Similarly, the current flowing through MOSFET 3 will decrease, so that the voltage drop across resistor 4 will decrease. In other words, the voltage V applied to the gate of MOSFET 1 increases. This increase in the gate voltage causes an increase in the current flowing through MOSFET 1, so that changes in the electrical characteristics of the inverter circuit containing MOSFETs 1 and 2 will necessarily be compensated as a result of the above-mentioned effect provided by resistor 4 and MOSFET 3.

Figure 2:
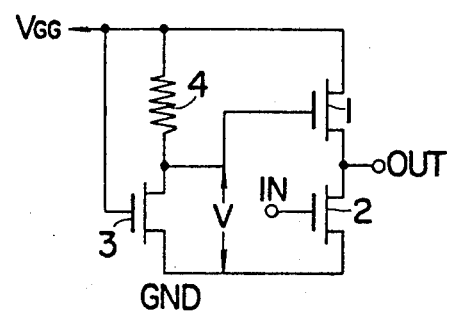
FIG. 2 depicts a modification of the circuit in FIG. 1 with respect to the electrode connections of the compensating MOSFET.

In another form of the invention, shown in FIG. 2, MOSFET 3 is of the enhancement type and its gate electrode is connected to the power supply source $V_{GG}$ for compensating changes both in the ambient temperature and the supply voltage. More specifically, when the supply voltage $V_{GG}$ increases, the voltage V supplied to the gate of the MOSFET 1 will increase. Similarly, the voltage applied to the gate MOSFET 3 will increase, causing an increase in the current flowing through the resistor 4 connected in series therewith. Thus, a voltage drop across the resistor 4 in this case will increase, causing a compensating decrease in the voltage V supplied to the gate of MOSFET 1. As a result, the voltage V will be balanced at a prescribed value irrespective of changes in the power supply voltage. In this case, if the MOSFET 3 is manufactured in the same MOSIC under the same conditions as the MOSFET 1, the compensation circuitry will compensate for differences in the electrical characteristics among the MOSICS.

Figure 3:
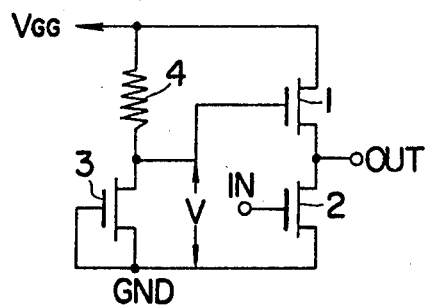
FIG. 3 depicts a further modification of the invention with respect to the electrode connections of the compensating MOSFET.

In a still further embodiment of the invention, depicted in FIG. 3, in contrast to the enhancement type MOSFET 3 shown in FIG. 2, described above, the MOSFET 3 in this case is a depletion type MOSFET and has its gate electrode connected to ground, rather than to the power supply voltage $V_{GG}$. This arrangement will compensate for changes in the electrical characteristics of the circuit in response to changes in the ambient temperature. This compensation arrangement will also compensate for differences in the electrical characteristics among a plurality of MOSICS when MOSFET 3 is manufactured under the same conditions as MOSFET 1 in the same MOSIC.

According to this arrangement, moreover, the resistor 4 should have a temperature coefficient much smaller than those of MOSFETS 1 and 3 and, for the resistance 4, a resistor of a high, constant or linear resistance value, manufactured separately from the MOSIC, may be employed.

With respect to the above described circuits shown in FIGS. 2 and 3, as was described above, differences in the electrical characteristics of the various MOSICS, manufactured on a mass-produced basis, may be compensated. For example, the threshold voltage $V_{th}$ of MOSFET 1 in a MOSIC is high, and the threshold voltage $V_{th}$ of MOSFET 3 in the MOSIC will also be high, which means that the current flowing through MOSFET 3 is relatively small. This means that the voltage V will be increased since the voltage drop across the resistor 4 is small; as a result, a decrease in the current flowing through the MOSFET 1, due to a high $V_{th}$ of the MOSFET will be compensated by an increase in the bias voltage V.

Furthermore, since the electrical characteristics of MOSIC circuits will be compensated, as described above, the above compensating circuits may be employed in pulse generator circuits to provide a stable oscillating frequency of the same. Moreover, since the differences in the electrical characteristics for a plurality of MOSICS, produced in a mass-production basis, will be compensated by the above described compensating circuitry, when the compensating circuit is embodied in a pulse generator MOSIC, the oscillating periods of the same will vary only in a small range, so that substantially uniform pulse generator MOSIC circuitry can be mass-produced.

Figure 4:
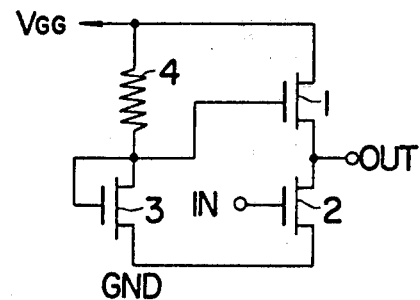
FIG. 4 depicts still a further modification of the present invention relating to the connection of the electrodes of the compensating MOSFET.

In accordance with modifications of the invention, the gate of the MOSFET 3 may be connected between the junction of resistor 4 and its connection with the MOSFET 1, as shown in FIG. 4.

Figure 5:
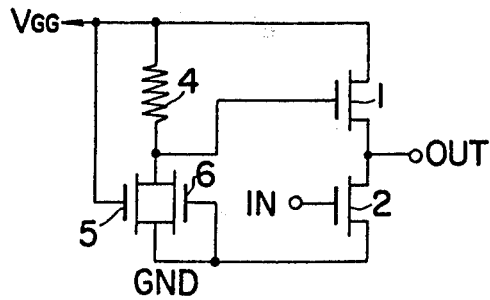
FIG. 5 depicts an embodiment of the present invention employing a pair of parallel connected MOSFETS in the compensating circuit.

Similarly, when the MOSFET 1 is of depletion type, a pair of MOSFETs may be employed in the compensation circuit. Namely, as is shown in FIG. 5, an enhancement type MOSFET 5 is connected in back-to-back parallel relationship with depletion type MOSFET 6. The gate electrode of MOSFET 6 is connected to ground, while the gate electrode of MOSFET 5 is connected to power supply voltage $V_{GG}$.

Figure 6:
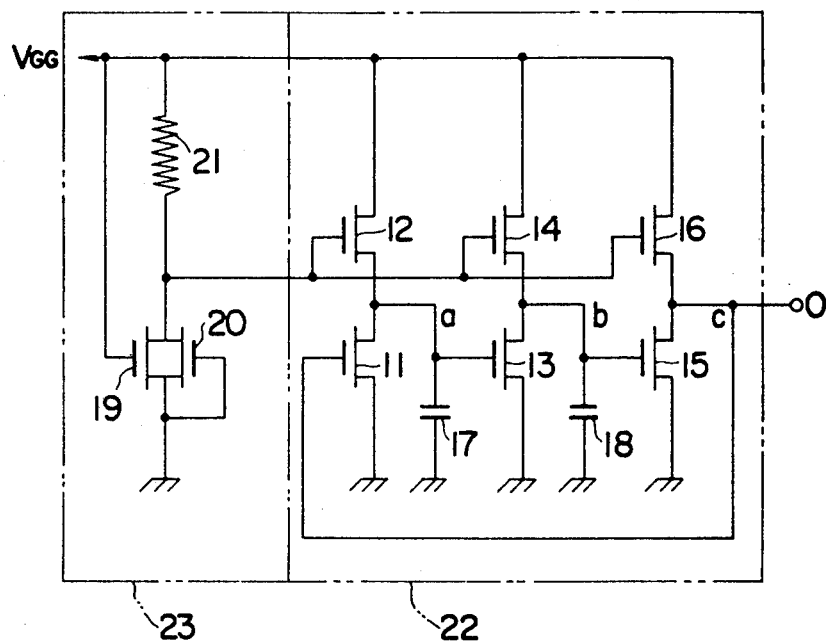
FIG. 6 depicts the present invention employed in a pulse generator circuit.

Shown in FIG. 6 is the use of compensating circuitry of the present invention in a practical embodiment of a pulse generator circuit, of the type, as described above, which may be employed in small-sized electronic calculators. Outlined in the broken-lined portions are the pulse generator circuit 22 and the compensating circuit 23 connected thereto.

In the pulse generator circuit, proper, are a plurality of p-channel enhancement type insulated gate field effect transistors 11, 13 and 15. In the compensating circuit 23, connected thereto, is a p-channel enhancement type insulated gate field effect transistor 19, connected in back-to-back relationship with depletion type MOSFET 20. Connected between the power supply voltage $V_{GG}$ and the pair of transistors of the compensating circuit is a high value resistance 21, which may have a value of 50 KΩ.

Connected between the respective transistors 11–13 and 13–15 and ground are capacitors 17 and 18 which may have a value of 0.1 to 10pF, for example. MOSFETs 12, 14 and 16 constitute load transistors for the respective MOSFETs 11, 13 and 15 and have their gates connected in common to the junction between resistor 21 and MOSFET pair 19–20.

All of the MOSFETs shown in FIG. 6 may be formed in the same semiconductor chip of monocrystalline silicon, while resistor 21 and capacitors 17 and 18 may be connected externally with respect to the MOSIC.

Input-output connections of the respective inverters 11–12, 13–14 and 15–16 are connected in cascade to form a closed loop. The source electrodes of MOSFETs 19, 20, 11, 13 and 15 are connected to ground, as are capacitors 17 and 18, with the gate of transistor 20 also being connected to ground, while the gate of transistor 19 is connected to source $V_{GG}$, as are the drain electrodes of transistors 12, 14 and 16. The output of the pulse generator circuit is taken from the drain of transistor 15.

Figure 7:
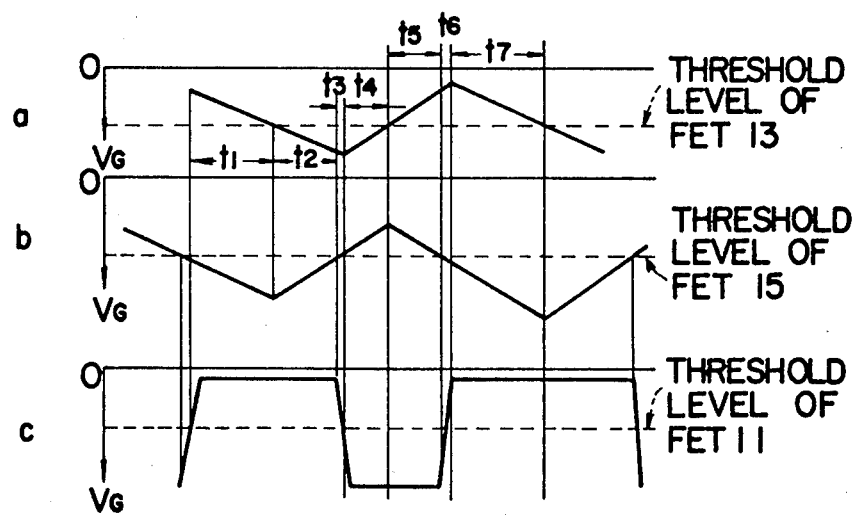
FIG. 7 illustrates respective timing diagrams for explaining the operation of FIG. 6.

With attention now directed to FIG. 7, the operation of the circuit of FIG. 6 will be explained.

It is assumed, for explanatory purposes, that during period of time $t_1$, MOSFET 15 is conductive, with a voltage having a lower absolute value than the threshold level of MOSFET 11 appearing at junction c, which is connected to the output terminal O. At this time, MOSFET 13 is cut-off, with capacitor 18 being charged by current flowing through the MOSFET 14. During the same period of time $t_1$, capacitor 17 begins charging, since MOSFET 11 is cut-off.

In this condition, when the output a of the first inverter circuit attains a larger absolute value than the threshold level of the MOSFET 13, during period of time $t_2$ as shown in FIG. 7a, MOSFET 13 starts conducting. Then, the charge which is stored in capacitor 18 is discharged through MOSFET 13.

Subsequently, when the output b of the inverter circuit 13–14 reaches a smaller absolute value than of the threshold level of MOSFET 15, during period of time $t_3$ as shown in FIG. 7b, MOSFET 15 becomes non-conductive or cut-off. The voltage change at the output of the inverter pair 15–16 or at the output terminal O (c) is rapid at this time, since the output of MOSFET 15 is not connected to a large valued capacitor. As a result, the output c of MOSFET 15 attains a larger absolute value than the threshold level of MOSFET 11, during period of time $t_4$, as shown in FIG. 7c, so that MOSFET 11 conducts.

Now, when the output a of MOSFET 11 becomes smaller than the threshold level of MOSFET 13, during period of time $t_5$, MOSFET 13 is cut-off, while MOSFET 15 is unaffected. When the output b of MOSFET 13 becomes larger than a threshold voltage of MOSFET 15, during period of time $t_6$, MOSFET 15 becomes conductive, so that the output c immediately changes its state to ground level. When the output c of MOSFET 15 becomes smaller than the threshold level of MOSFET 11, during period of time $t_7$, MOSFET 11 is cut-off and the voltage output a gradually increases. Subsequently, the same operations as described above are repeated for the operation of the pulse generator 22.

As a result, the output of the pulse generator at terminal O will have the waveform shown in FIG. 7c.

However, as was mentioned previously, the oscillating period of the pulse generator circuit 22 suffers from changes in the ambient temperature and power supply voltage. Moreover, MOSICs which are manufactured to include such a pulse generator circuit will have different oscillating periods due to differences in the circuit constants of the respective MOSFETs making up the MOSICs. In order to overcome these deficiencies, a compensating circuit 23 is provided, as described previously. Since MOSFET 20, connected in back-to-back parallel relationship with the MOSFET 19 is manufactured in accordance with the same conditions as MOSFETs 12, 14 and 16, MOSFET 20 will have the same threshold voltage $V_{th}$ as these MOSFETs.

Now, considering the compensating effect of compensation circuit 23, when the ambient temperature of the pulse generator circuit 22 increases, the current which flows through MOSFETs 12 and 14 will decrease, resulting in an increase in the time which is required to charge capacitors 17 and 18. As a result, the duty ratio or the period of the pulse generator will increase, unless something is done to compensate for this condition.

In accordance with the present invention, however, because of the compensation circuit 23, the current flowing through the MOSFETs 19 and 20 will also decrease when the ambient temperature increases. Then, since the voltage drop across the resistor 21 increases, the gate voltage which is applied to the gates of MOSFETs 12 and 14 will increase, so as to increase the current flowing therethrough. As a result, what would be a decrease in the duty ratio or the oscillating period is compensated.

Similarly, for a change in the power supply voltage $V_{GG}$, when the same increases, there will be an increase in the current flowing through the respective MOSFETs 12 and 14. However, this increase is compensated by an increase in the voltage drop across the resistor 21, since the current flowing through the MOSFET 19 will also be increased. As a result, compensation for changes in the supply voltage are effected.

It can be seen, therefore, that applicant's invention provides compensation for changes in ambient temperature, supply voltage and differences in the electrical characteristics of respective MOSFETs making up differently manufactured MOSICs under the same operating conditions, since the MOSFETs of the compensating circuit are manufactured in accordance with the same producton conditions as the MOSFETs making up the pulse generator circuit.

While we have shown and described several embodiments in accordance with the present invention, it is understood that the same is not limited thereto but is susceptible of numerous changes and modifications as known to a person skilled in the art, and We therefore do not wish to be limited to the details shown and described herein but intend to cover all such changes and modifications as are obvious to one of ordinary skill in the art.

What we claim:

1. A pulse generator circuit comprising
    first, second and third insulated gate field effect transistors of the enhancement type, the drain electrode of the first transistor being connected to the gate electrode of the second transistor, the drain electrode of the second transistor being connected to the gate electrode of the third transistor, the drain electrode of the third transistor being connected to the gate electrode of the first transistor, the source electrodes of the first, second and third transistors being connected to a first voltage source;
    fourth, fifth and sixth insulated gate field effect transistors of the depletion type, the source electrodes of the fourth, fifth and sixth transistors being connected to the drain electrodes of the first, second and third transistors, respectively, the drain electrodes of the fourth, fifth and sixth transistors being connected to a second voltage source, the gate electrodes of the fourth, fifth and sixth transistors being connected in common;
    a seventh gate field effect transistor of the enhancement type, the gate electrode of which is coupled to said second voltage source;
    an eighth insulated gate field effect transistor of the depletion type connected in parallel to said seventh transistor, the commonly connected source electrodes being connected to said first voltage source, the commonly connected drain electrodes being connected to the commonly connected gate electrodes of said fourth, fifth and sixth transistors, the gate electrode of the eighth transistor being connected to the source electrode thereof; and
    a resistor connected between the commonly connected drain electrodes of said seventh and eighth transistors and said second voltage source.

2. A pulse generator circuit according to claim 1, wherein said pulse generator further includes a first capacitor connected between the drain electrode of said first transistor and said first voltage source, and a second capacitor connected between the drain electrode of said second transistor and said first voltage source.

3. A pulse generator circuit comprising:
    first, second and third insulated gate field effect transistors,
        the drain electrode of the first transistor being coupled to the gate electrode of the second transistor,
        the drain electrode of the second transistor being coupled to the gate electrode of the third transistor,
        the drain electrode of the third transistor being coupled to the gate electrode of the first transistor, and
        the source electrodes of the first, second and third transistors being connected to a first voltage source;
    fourth, fifth and sixth insulated gate field effect transistors, the source electrodes of the fourth, fifth and sixth transistors being connected to the drain electrodes of the first, second and third transistors, respectively.

the drain electrodes of the fourth, fifth and sixth transistors being connected to a second voltage source, and the gate electrodes of the fourth and fifth transistors being connected in common;

a seventh insulated gate field effect transistor, the source electrode of the seventh transistor being connected to said first voltage source, the drain electrode of the seventh transistor being connected to the commonly connected gate electrodes of said fourth and fifth transistors, and the gate electrode of the seventh transistor being coupled to said first voltage source; and a resistor connected between the drain electrode of said seventh transistor and said second voltage source.

4. A pulse generator circuit according to claim 3, wherein said pulse generator further includes a first capacitor connected between the drain electrode of said first transistor and said first voltage source, and a second capacitor coupled between the drain electrode of said second transistor and said first voltage source.

5. A pulse generator circuit according to claim 3, wherein the gate of the sixth transistor is connected to the drain electrode of said seventh transistor.

6. A pulse generator circuit according to claim 3, wherein the current flow through said resistor is substantially linearly proportional to the voltage drop thereacross.

7. A pulse generator circuit according to claim 3, wherein said pulse generator further includes an eighth insulated gate field effect transistor connected in parallel with said seventh transistor, the commonly connected source electrodes being connected to said first voltage source, the commonly connected drain electrodes being connected to the commonly connected gate electrodes of said fourth and fifth transistors, and the gate electrode of the eighth transistor being connected to the source electrode thereof.

8. A pulse generator circuit according to claim 7, wherein the current flow through said resistor is substantially linearly proportional to the voltage drop thereacross.

* * * * *